United States Patent
Weinmann et al.

(10) Patent No.: US 8,282,424 B2
(45) Date of Patent: Oct. 9, 2012

(54) TELECOMMUNICATIONS JACK WITH A MULTILAYER PCB

(75) Inventors: Christian Weinmann, Alsdorf (DE); Stefan Schoene, Bochum (DE); Anton Kuepper, Kaarst (DE); Gerardus A. C. A. Nuiten, Neuss (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/142,475

(22) PCT Filed: Jan. 12, 2010

(86) PCT No.: PCT/US2010/020729
§ 371 (c)(1),
(2), (4) Date: Jun. 28, 2011

(87) PCT Pub. No.: WO2010/083150
PCT Pub. Date: Jul. 22, 2010

(65) Prior Publication Data
US 2011/0281474 A1 Nov. 17, 2011

(30) Foreign Application Priority Data
Jan. 15, 2009 (EP) .................. 09150611

(51) Int. Cl.
*H01R 24/00* (2011.01)
(52) U.S. Cl. .............. 439/676; 439/76.1; 439/941
(58) Field of Classification Search ............... 439/76.1, 439/941, 676
See application file for complete search history.

(56) References Cited

U.S. PATENT DOCUMENTS

| | | | | |
|---|---|---|---|---|
| 5,295,869 | A | * | 3/1994 | Siemon et al. ........... 439/620.22 |
| 5,940,959 | A | * | 8/1999 | Caveney et al. ............. 439/676 |
| 6,089,923 | A | | 7/2000 | Phommachanh |
| 6,196,880 | B1 | * | 3/2001 | Goodrich et al. ............. 439/676 |
| 6,336,827 | B1 | * | 1/2002 | Akama et al. ........... 439/607.46 |
| 6,364,712 | B2 | * | 4/2002 | Durr et al. ................ 439/620.09 |
| 6,464,541 | B1 | * | 10/2002 | Hashim et al. ................ 439/676 |
| 6,614,325 | B1 | | 9/2003 | Kocin |
| 6,769,937 | B1 | * | 8/2004 | Roberts ......................... 439/676 |
| 6,773,302 | B2 | * | 8/2004 | Gutierrez et al. ............. 439/941 |
| 7,038,918 | B2 | * | 5/2006 | AbuGhazaleh et al. ...... 439/676 |
| 7,244,126 | B2 | * | 7/2007 | Morana et al. ............... 439/76.1 |

(Continued)

FOREIGN PATENT DOCUMENTS
DE       100 00 016 A1    7/2000
(Continued)

*Primary Examiner* — Briggitte R Hammond
(74) *Attorney, Agent, or Firm* — Janet A. Kling (57) ABSTRACT

A telecommunications jack 1 is described that comprises a housing 2 defining a port for receiving a plug; contacts 7 for making an electrical connection with wires of a cable; interface contacts 4 for making an electrical connection with contacts of the plug; and a multilayer printed circuit board (PCB) 5 for electrically connecting the contacts 7 and the interface contacts 4. The multilayer PCB comprises a free-floating ground plane structure formed from two outer layers of the multilayer PCB and a plurality of internal layers 15B, 15C, 15D, 15E having a plurality of electronic devices 16, 17 disposed thereon. The two outer layers 15 of the multilayer PCB include a continuous coating 19 of electrically conductive material covering at least those parts of the PCB that include the electronic devices and wherein the two outer layers of the PCB are electrically connected with each other and are electrically isolated from the internal layers of the PCB.

11 Claims, 5 Drawing Sheets

U.S. PATENT DOCUMENTS

| | | | |
|---|---|---|---|
| 7,384,315 B2 | 6/2008 | Caveney et al. | |
| 7,658,622 B2 * | 2/2010 | Bartholomew | 439/76.1 |
| 7,837,513 B2 * | 11/2010 | Millette et al. | 439/676 |
| 8,113,888 B2 * | 2/2012 | Carter et al. | 439/676 |
| 2004/0251046 A1 * | 12/2004 | Mickievicz et al. | 174/260 |
| 2005/0221638 A1 * | 10/2005 | Berberich | 439/76.1 |
| 2006/0121790 A1 * | 6/2006 | Hashim | 439/676 |
| 2007/0238365 A1 | 10/2007 | Hammond, Jr. et al. | |
| 2007/0238366 A1 | 10/2007 | Hammond, Jr. et al. | |
| 2007/0238367 A1 | 10/2007 | Hammond, Jr. et al. | |
| 2009/0264011 A1 * | 10/2009 | Wang | 439/507 |

FOREIGN PATENT DOCUMENTS

| | | |
|---|---|---|
| EP | 0 233 397 A1 | 8/1987 |
| EP | 0 614 331 A2 | 9/1994 |
| EP | 1 069 655 A2 | 1/2001 |
| EP | 1 753 093 A1 | 2/2007 |

* cited by examiner

TELECOMMUNICATIONS JACK WITH A MULTILAYER PCB

CROSS REFERENCE TO RELATED APPLICATIONS

This application is a national stage filing under 35 U.S.C. 371 of PCT/US2010/020729, filed Jan. 12, 2010, which claims priority to European Patent Office Application No. 09150611.3, filed Jan. 15, 2009, the disclosure of which is incorporated by reference in its/their entirety herein.

TECHNICAL FIELD

The invention relates to a telecommunications jack that is configured to compensate for near end and far end cross talk.

BACKGROUND ART

In the telecommunications industry, as data transmission rates have steadily increased, crosstalk effects due to capacitive and inductive couplings among the closely spaced and/or parallel contacts that function as conductors within the jack and/or plug have become a subject. Modular connectors with improved crosstalk performance have been designed to meet the increased standards.

U.S. Pat. No. 7,384,315 B2 discloses an electrical connector with contacts for making an electrical connection with wires of a cable and with interface contacts for making an electrical connection with contacts of a plug. The two kinds of contacts are connected over conductive traces. The plug has compensation structures which include an inductor-capacitor combination providing cross talk compensation properties.

U.S. Pat. No. 6,089,923 B discloses an electrical connector with contacts for making an electrical connection with wires of a cable and with interface contacts for making an electrical connection with contacts of a plug. The two kinds of contacts are connected over a printed circuit board (PCB). The PCB contains several compensation means such as capacitors. US 2007/0238365 A1, US 2007/0238366 A1 and US 2007/0238367 A1 also disclose an electrical connector with a PCB containing several compensation means to overcome cross talk effects.

U.S. Pat. No. 5,940,959 B discloses a capacitor label that capacitively couples a first contact of one contact pair to a second contact of a second contact pair to reduce near end cross talk between adjacent contacts.

There is a need for an electronic connector with contacts for making an electrical connection with wires of a cable and with interface contacts for making an electrical connection with contacts of a plug with improved cross talk compensation attributes.

SUMMARY OF THE INVENTION

The invention provides a telecommunications jack comprising a housing defining a port for receiving a plug; contacts for making an electrical connection with wires of a cable; interface contacts for making an electrical connection with contacts of the plug; and a multilayer printed circuit board (PCB) for electrically connecting the contacts and the interface contacts. The multilayer PCB comprises a free-floating ground plane structure formed from two outer layers of the multilayer PCB and a plurality of internal layers having a plurality of electronic devices disposed thereon. The two outer layers of the multilayer PCB include a continuous coating of electrically conductive material covering at least those parts of the PCB that include the electronic devices and wherein the two outer layers of the PCB are electrically connected with each other and are electrically isolated from the internal layers of the PCB.

The telecommunications jack offers the possibility of connecting wires of a cable with contacts of a plug. Therefore, the jack provides on the one side contacts for making an electrical connection with wires of a cable. Such contacts may be insulation displacement contacts (IDCs) or other equivalent contacts such as for example wire-wrap contacts. On the other side, the jack provides interface contacts for making an electrical connection with contacts of a plug. The interface contacts are adapted to the shape of the contacts of the plug and designed such that it is possible to connect, disconnect and reconnect the contacts of the plug with the interface contacts of the jack several times.

The housing of the jack may be made out of electrically non-conductive or isolating material such as for example plastic. It is also possible that the housing contains parts that are made out of electrical conductive material such as for example metals like copper, steel etc. e.g. in the shape of sheet metal, conductive polymers etc. for protecting or shielding the parts located inside of the plug from environmental influences.

The jack, according to the invention, also contains a PCB that electrically connects the wire contacts with the plug interface contacts. Therefore, the PCB contains several conductive paths leading from one kind of contact to the other kind of contact. Within the conductive paths or circuits on the PCB, electronic devices are arranged. These devices may have compensation features for compensating crosstalk effects that occur within the plug and/or the jack itself. The conductive paths or circuits as well as the electronic devices may be made out of copper or other suitable materials such as silver or conductive inks. The PCB can be a multilayer PCB that means that the PCB provides several different layers that are arranged in a parallel manner. The layers may comprise a non-conductive supporting substrate carrying conductive paths and electronic devices as described above and may be electrically connected with each other. The layers or non-conductive support substrates of the PCB may be made for example out of fibre reinforced epoxy resin such as for example FR4 or FR408. By providing such a multilayer PCB, it is possible to arrange the electronic devices in a space saving manner, e.g. to increase the density of electronic devices within the jack.

According to the invention, the two outer layers of the PCB provide a continuous coating of electrically conductive material such as for example copper, silver or conductive ink. These continuous coatings cover at least those parts of the PCB where the electronic devices are arranged on the internal layers of the PCB. The continuous coatings may be applied to a non-conductive supporting substrate as described above. The continuous coatings may also be applied in any other suitable way on the two outer sides of the PCB as long as they are electrically isolated from the conductive paths and the electronic devices of the interior layers of the PCB.

Furthermore, the continuous coatings of the two outer layers are electrically connected with each other. In an exemplary aspect, the coatings may be made out of copper. By providing two outer layers made out of electrically conductive material that are electrically connected with each other, the inner circuits on the interior layers of the PCB are shielded. In other words, the electronic devices and the conductive paths on the PCB are protected from environmental influences such as for example radiated electric fields from other cables or created by other electrical circuits or conducting parts. That has the advantage that the electronic processes on the PCB run with high quality and the risk that they are disturbed by any outer influence is minimized.

The continuous coatings on the outer layers form a pair of free-floating ground planes which are not connected to any other element in PCB and are therefore isolated from the other elements on the PCB. Additionally, this free-floating ground plane structure does not require an external ground connection in the jack in order to enhance the crosstalk performance of the jack. In this way, PCB can provide enhanced crosstalk performance to both shielded and non-shielded jack constructions. This free-floating ground plane structure can act as a faraday cage around the internal layers of PCB to enhance shielding effectiveness.

The telecommunications jack according to the invention may be a RJ 45 jack. It is also possible to integrate the invention into other kind of jacks such as for example RJ 11 or the like.

The continuous coatings of the two outer layers of the PCB may provide openings or cut outs around areas that act as connection areas for receiving the wire and interface contacts of the telecommunications jack. These connection areas may be holes within the PCB and provide an electrically conductive zone for establishing the electrical connection between the contacts and a corresponding conductive path on the interior layers of the PCB. In an exemplary aspect, the holes can go through all of the layers of the multilayer PCB. They may be completely or partially coated by an electrically conductive material such as copper, silver and/or tin. The contacts may be connected to the holes for example via press fit or soldering. A tin, lead-tin or other soldering process may be used. A nonconductive buffer region can be disposed around the openings or cut outs in the continuous coatings of the outer layers to ensure that the two outer layers are not electrically connected with the connection areas for the wire and interface contacts.

The continuous coatings of the two outer layers of the PCB also may provide openings or cut outs around vertical conductive paths that go through all layers of the PCB and connect the two continuous coating layers with each other. The continuous coatings and the vertical conductive paths may be connected via at least one conductive path on the outer layers. It is also possible that the continuous coatings do not provide cut outs around these vertical conductive paths or vias, but reach right to the edge of the conductive continuous coating of the paths or vias.

As already explained above the telecommunications jack may contain compensation circuits formed by the electronic devices. The electronic devices of the PCB may be circuit elements such as for example capacitors, inductors and/or couplers. The circuit elements may be translated into patterns that are able to deliver compensation characteristics. Furthermore, the circuit elements may be integrated into the PCB over more than one layer. Such patterns may be for example two parallel essentially rectangular structures, both structures arranged in adjacent layers of the PCB. Such structures may function as capacitors. Another example for such a pattern are helical structures to form an inductor. Two of such structures, each arranged in one layer of the PCB may function as coupler or inductor.

BRIEF DESCRIPTION OF THE DRAWINGS

The invention will now be described in more detail with reference to the following Figures exemplifying particular embodiments of the invention.

DESCRIPTION OF EMBODIMENTS

Herein below various embodiments of the present invention are described and shown in the drawings wherein like elements are provided with the same reference numbers.

Figure 1:
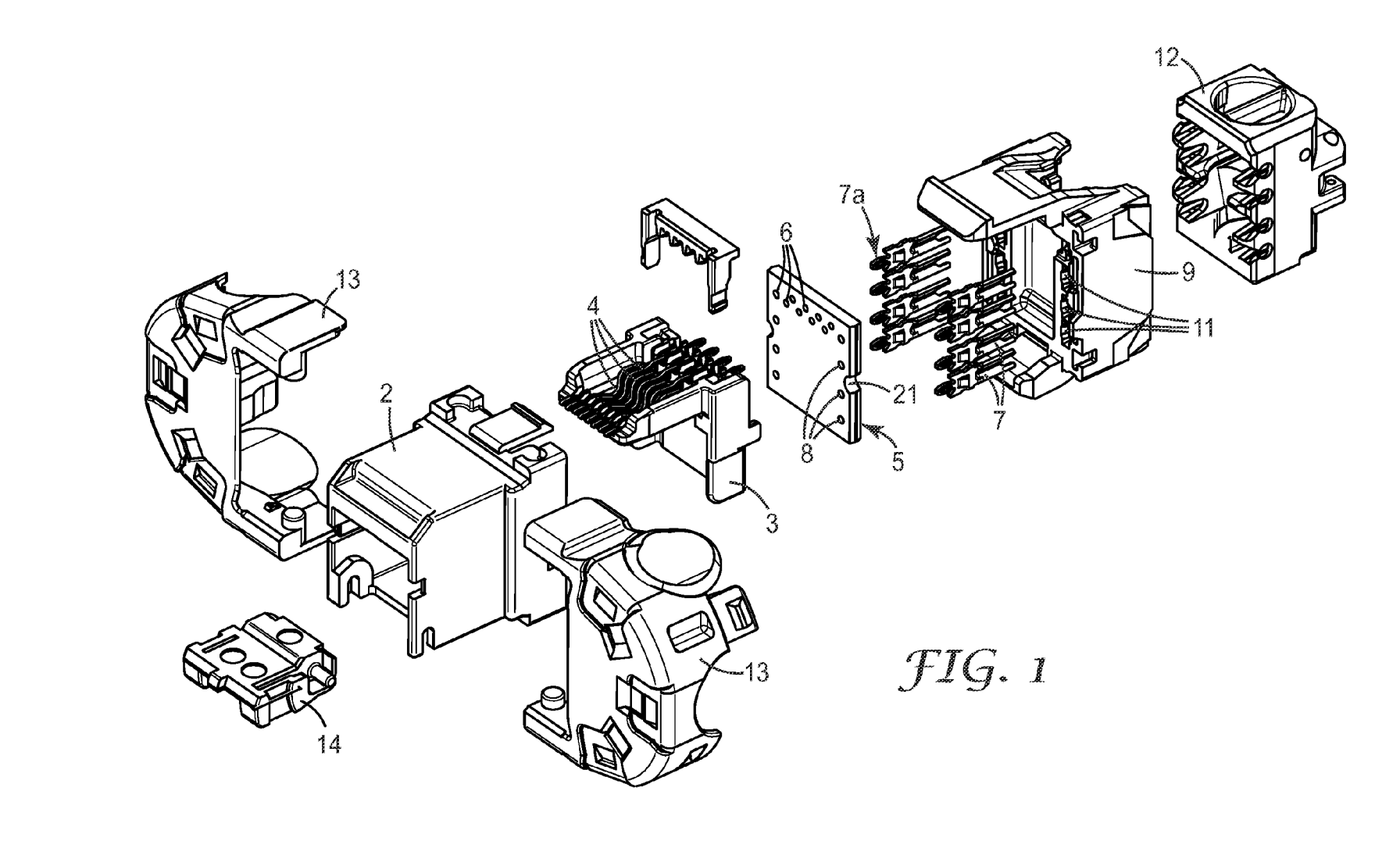
FIG. 1 is an exploded isometric view of a telecommunications jack according to the current invention.

FIG. 1 shows an exploded isometric view of a telecommunications jack 1 according to the invention into which a plug (not shown) may be inserted. The plug may terminate a length of twisted pair communication cable, while the jack 1 may be connected to another piece of twisted pair communication cable (also not shown). As shown from the left to the right, the jack 1 includes a main housing 2 and support member 3 arranged in the main housing 2 to support eight plug interface contacts 4. The plug interface contacts 4 engage a printed circuit board (PCB) 5 from the front side thereof via through-holes 6 in the PCB 5. Eight insulation displacement contacts (IDCs) 7 engage the PCB 5 from the rear side of the PCB via additional through-holes 8 into which pins 7a on the IDCs are inserted. The through holes 8 and the pins 7a may work together as a press fit or the pins may be soldered into the through-holes 8. A rear housing 9 having passageways 11 for the IDCs 7, and a guide piece 12 serve to provide an interface to the twisted pair communication cable. The main housing 2 also comprises two flaps 13 for holding the whole assembly (main housing 2, support member 3 with the plug interface contacts 4 and IDCs 7, PCB 5, rear housing 9 and guide piece 12) together and a dust shutter 14 for sealing the opening or port of the main housing 2 into which the plug may be inserted. The flaps 13 and the dust shutter 14 are pivotally attached to the main housing 2.

Figure 2:
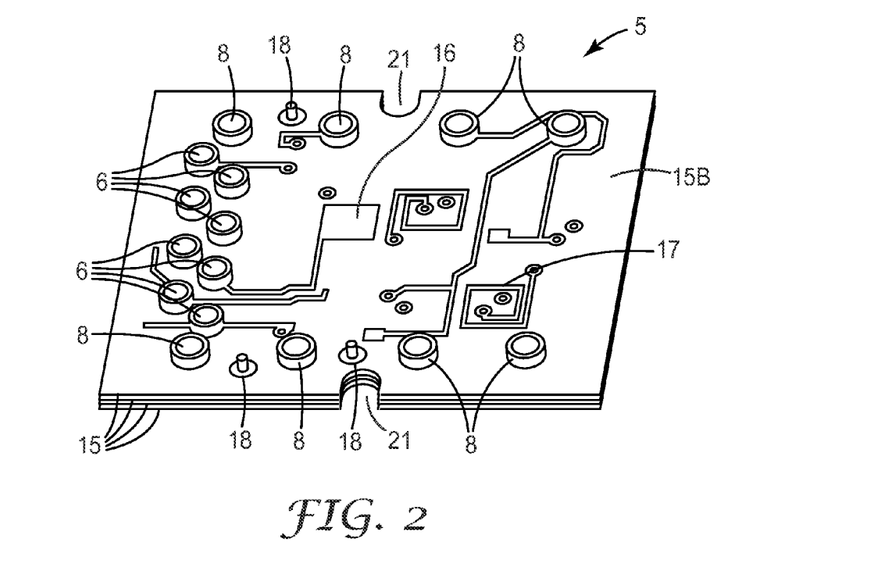
FIG. 2 is a view of an internal layer of a multilayer printed circuit (PCB) board with different electronic devices usable in a telecommunications jack according to the invention.

FIG. 2 shows a view on top of the PCB 5 with different electronic devices 16, 17 (e.g. capacitors and inductor/couplers, respectively) being part of the telecommunications jack 1. According to an exemplary embodiment of the invention, the PCB can have multiple layers 15. The multilayer PCB 5 makes the electrical connection between the plug interface contacts 4 and the IDCs 7 via circuits thereby compensating any cross talk effects that may be present. The jack 1 may have additional compensating means such as for example a capacitor in the area of the plug interface contacts 4 such as is described in European Patent No. 1 753 093. The PCB 5 provides on its layers 15 conductive paths and electronic devices both made out of electrically conductive material, such as for example copper. The side of the PCB 5 shown in FIG. 2 may be the front side or the rear side of the PCB 5. It can be seen the through-holes 6 for the plug interface contacts 4 as well as the through-holes 8 for the IDCs 7. There may be different designs of the jack 1. Therefore the through-holes 6, 8 of FIG. 2 may be oriented in different positions. Such design differences do not have any influence on the principle of the described invention. The inside of the through-holes 6, 8 are coated with an electrically conductive material, such as for example copper, to establish an electrical connection between the plug interface contacts 4 and IDCs 7 and the circuits on the PCB 5. The PCB 5 further comprises vertical conductive paths 18. Vertical conductive paths or vias 18 are conductive paths that electrically connect different layers 15 of the PCB 5 with each other or conductive paths on different layers 15 of the PCB 5.

The PCB 5 may be fixed inside of the main housing 2 at the support member 3 with half round cut-outs 21 that work together with pins at the support member 3 as can be seen in FIG. 1. Instead of the cut-outs 21, the PCB 5 may provide holes notches or other alignment features that work together with pins on support member 3 of a housing of a jack. Alternatively, the PCB may be glued to a support member or fixed in any other suitable way.

As already described and will be described in more detail with reference to FIGS. 4A-4F, the PCB 5 comprises several layers 15, specifically layers 15A-15F as shown in FIGS. 4A-4F, and several electronic devices 16, 17. By providing a PCB 5 with several layers 15A-15F, it is possible to arrange the electronic devices 16, 17 in a space saving manner, e.g. to increase the density of electronic devices 16, 17 and leading to an increased exploitation of the available PCB space. In such a multilayer PCB, interaction between adjacent components or electronic devices 16, 17 can be beneficially used in the circuits to generate additional coupling effects. The electronic devices 16, 17 that are positioned in the PCB 5 are for example capacitors 16, inductors and/or couplers 17. They may be made out of copper or any other suitable material such as for example silver or a conductive ink. Similarly, the conductive paths and the coated through-holes 6, 8 may be made out of copper or any other suitable material such as for example silver or a conductive ink. The electronic devices 16, 17 have such a shape and/or dimension such that they deliver compensation characteristics for compensating cross talk effects. On the right lower side of FIG. 2 can be seen a structure 16 made out of copper that functions as a capacitor. Left from capacitor structure 16 can be seen a helical structure 17 that functions as an inductor or coupler. Those structures interact with corresponding structures on other adjacent layers 15 that cannot be seen in FIG. 2 but will be described in connection with FIG. 4A-4F, thereby using the PCB 5 in all dimensions. In the exemplary aspects shown in FIGS. 2 and 4A-4F, the capacitor structure is comprised of a first capacitor plate portion, designated by a single prime notation such as "first capacitor plate portion 16'", and a second capacitor plate portion, designated by a double prime notation such as "second capacitor plate portion 16''". In the exemplary aspects shown in FIGS. 2 and 4A-4F, the inductor structure 17 is comprised of a first inductor coil, designated by a single prime notation such as "first inductor coil 17'", and a second inductor coil, designated by a double prime notation such as "second inductor coil 17''".

Figure 3:
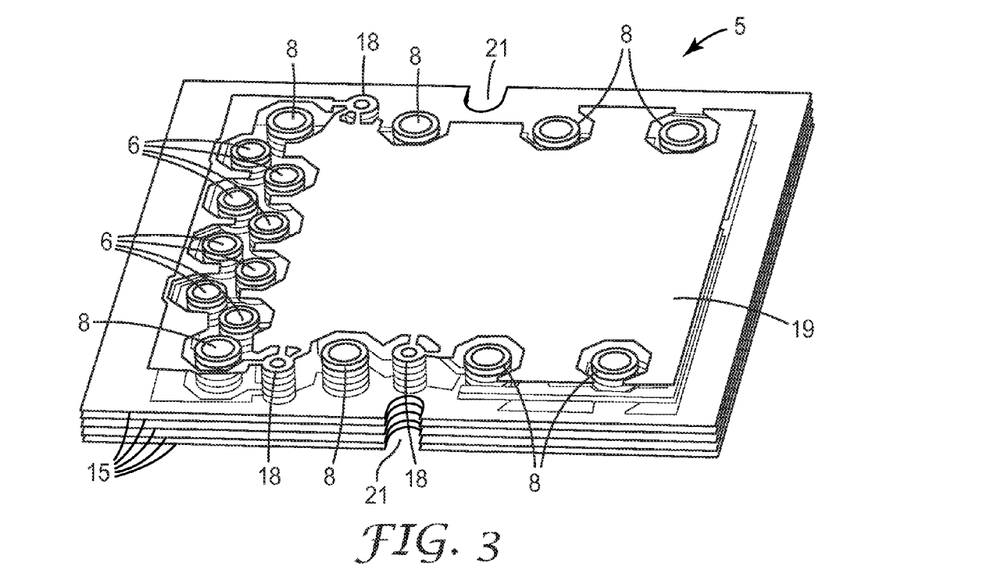
FIG. 3 is a view of an outer layer of the multilayer printed circuit board shown in FIG. 2 having a continuous coating of an electrically conductive material.

In order to protect the circuits on the PCB 5 from environmental influences, the outer layers 15A (shown in FIGS. 3 and 4A) and 15F (shown in FIG. 4F) of the PCB 5 provide a continuous coating 19 or a continuous plated layer of an electrically conductive material, such as for example copper, covering at least those parts of the PCB 5 that include electronic devices 16, 17 disposed on the interior layers of the PCB. In FIG. 3, the continuous coating 19 of one side (e.g. layer 15A) of the PCB 5 can be seen. As will be described in connection with FIG. 4F there is also a continuous coated layer 15F on the other side of the PCB 5. Both continuous coatings 19 of layers 15A and 15F are electrically connected with each other over vertical conductive paths 18 that go through all of the internal layers 15B-15E of the PCB 5. The conductive outer layers 15A, 15F are not electrically connected with any of the internal layers 15B-15E of the PCB 5.

Figure 4A:
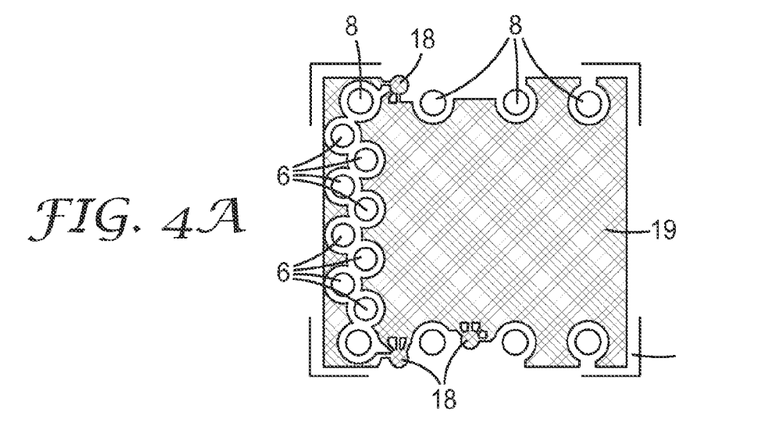
FIGS. 4A-4F show exemplary layers of the PCB shown in FIG. 3.
Figure 4B:
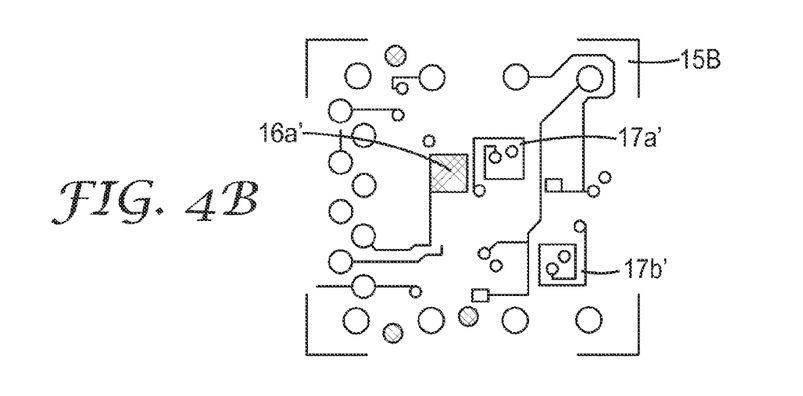
Figure 4C:
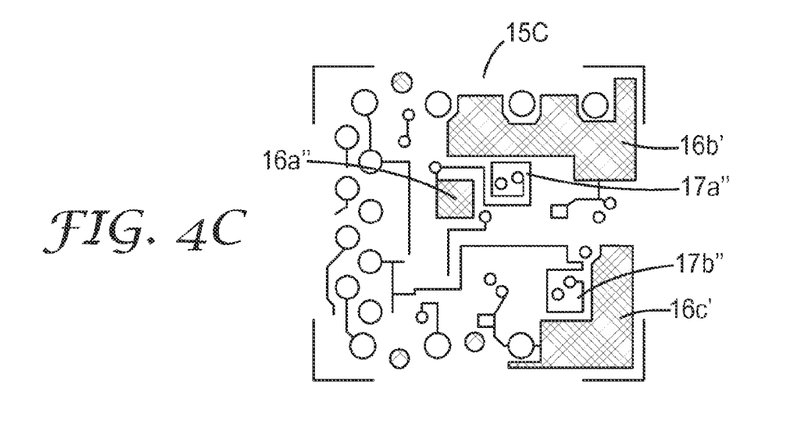
Figure 4D:
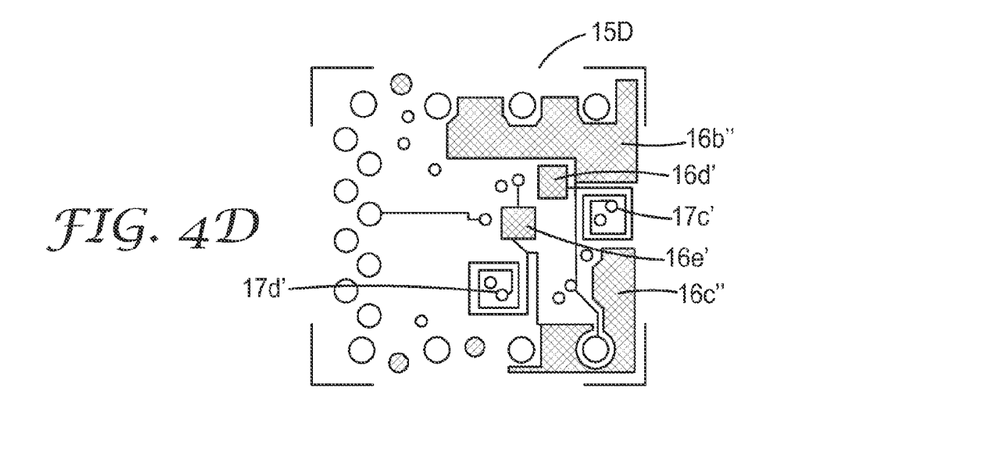
Figure 4E:
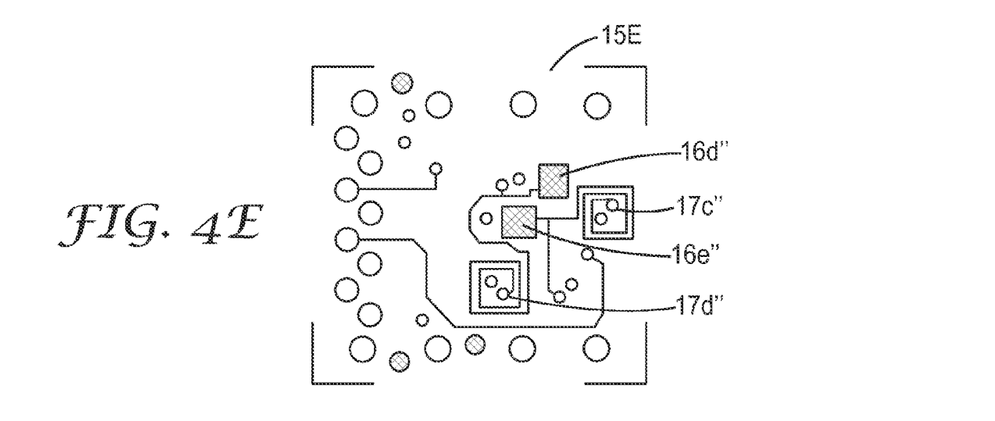
Figure 4F:
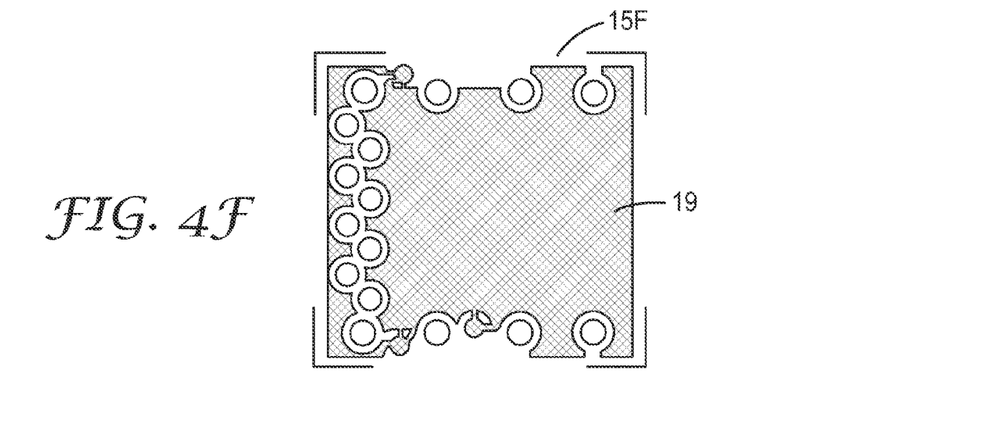

Thus, continuous coatings 19 on layers 15A, 15F form a pair of free-floating ground planes which are not connected to any other element in PCB 5 and are therefore isolated from the other elements on the PCB. Additionally, this free-floating ground plane structure does not require an external ground connection in the jack in order to enhance the crosstalk performance of the jack. In this way, PCB 5 can provide enhanced crosstalk performance to both shielded and non-shielded jack constructions. This free-floating ground plane structure acts as a faraday cage around the internal layers 15B-15E of PCB 5 to enhance shield effectiveness.

In contrast, shielding plates in conventional jacks are connected to a common ground which guides any disruptive inducted current into the shielding plates and passes it to ground.

The continuous coating 19 of the embodiment shown in FIG. 3 covers all parts of the PCB 5 where electronic devices and/or conductive paths are placed with two exceptions: it does not cover the through-holes 6, 8 and the vertical conductive paths 18. The through-holes 6, 8 are not electrically connected with the coating while the vertical conductive paths 18 are electrically connected with the coating 19 via for example a small path. According to another embodiment of the invention the continuous coating 8 may reach to the edge of the vertical conductive path 18 and may be electrically connected with the vertical conductive path 18.

In FIG. 4A-4F, the different layers 15A-15F of the PCB 5 shown in FIG. 2 and FIG. 3 are seen. The top layer 15A (FIG. 4A) and the bottom layer 15F (FIG. 4F) are provided with a continuous coating 19 made of electrically conductive material as described above. The continuous coating 19 extends over the majority of the top layer 15A and the bottom layer 15F of the PCB 5 with the exception of the through-holes 6, 8 and the vertical conductive paths 18. In layer 15B (FIG. 4B) can be seen two helical structures, first inductor coils 17a', 17b' that interact with corresponding similar helical structures, second inductor coils 17a'', 17b'', on layer 15C (FIG. 4C) and each pair of inductor coils 17a', 17a'' and 17b', 17b'' function as a coupler/inductor 17. The inductor coil structures 17a', 17b' of the layer 15B and the inductor coil structure 17a'', 17b'' of the layer 15C are placed in the vicinity of each other so that their shapes are arranged parallel to each other. Layer 15B can also be seen a plan square structure representing first capacitor plate 16a' which is paired and interacts with a corresponding similar shaped plan structure, second capacitor plate 16a'', on layer 15C. The pair of capacitor plates 16a' and 16a'' function as a capacitor 16. The first capacitor plate structure 16a' on layer 15B and the second capacitor plate structure 16a'' on layer 15C are placed in the vicinity of each other so that they are arranged parallel to each other. Layer 15C further provides two additional first capacitor plate structures 16b', 16c' with several edges that interact with similar shaped second capacitor plate structures 16b'', 16c'' on layer 15D (FIG. 4D) that together function as capacitors. Layer 15D provides two further first capacitor plate structures 16d', 16e' that interact with similar shaped structures 16d'', 16e'' on layer 15E (FIG. 4E) as well as two helical structures 17c', 17d' that interact with similar shaped structures 17c'', 17d'' on layer 15E.

While the multilayer PCB of the current disclosure describes a six layer PCB, one of ordinary skill would understand that board designs having a different number of layers are possible. These design differences do not have any influence on the principle of the described invention. The multilayer PCB of the current invention can have any number of layers more than 3 layers (i.e. two outer layers and at least one interior layer).

Figure 5:
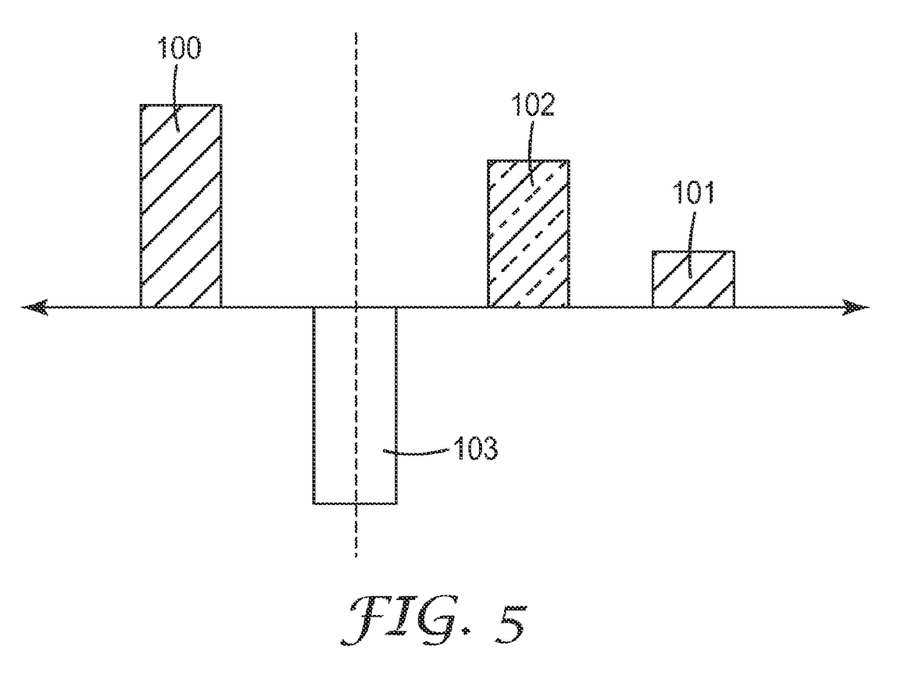
FIG. 5 is a diagram showing a symmetrisation principle according to another aspect of the invention.

Due to the fact that the jack 1 provides different kind of contacts on its front side—plug interface contacts 4—and on its rear side—IDCs 7—the cross talk effects caused by the different contacts are different as well. The cross talk generated by the rear side contacts 7 of the jack 1 is much smaller resulting in different cross talk values measured from the front side and from the rear side of the jack. This relationship is illustrated in FIG. 5. The left side of the diagram refers to the front side of the jack 1 with the plug interface contacts 4 and the right side of the diagram refers to the rear side of the jack 1 with the IDCs 7. The dotted line in the middle of the diagram stands for the symmetrisation plane of the jack 1. The first block 100 illustrates the cross talk generated by the front side (or plug interface) contacts 4 of the jack 1. The last block 101 illustrates the cross talk generated by the rear side (or IDC) contacts 7 of the jack 1. As can be seen in FIG. 5, the blocks 100 and 101 represent different levels of crosstalk generation. In order to have a jack that has minimal interference from crosstalk, these differences must be balanced and compensated.

To overcome this situation, the invention proposes to first make both sides of the symmetrisation plane equal regarding their cross talk effects. This is done by providing additional cross talk generating means or so called symmetrisation elements to the rear side of the jack, illustrated in the diagram by the block 102. The additional crosstalk generating means may be integrated into the PCB by adding capacitive or inductive coupling between conductors in the PCB. It is also possible to add additional crosstalk generating means else where in the jack. Now that both sides are equal regarding the magnitude of their cross talk generation, it is possible to compensate for the crosstalk by adding a common compensation element which counterbalances the crosstalk generated within the jack. This counterbalancing is illustrated in FIG. 5 by block 103. The compensation element can be placed inside the jack to compensate for all cross talk effects generated by the jack elements that means the cross talk effects generated by the plug interface contacts 4, the IDCs 7 as well as by the compensation element to compensate front contact cross talk. The common compensation element, such as a capacitor or inductor, may be integrated in the PCB. It is also possible to arrange them somewhere else in the jack. In such a setting one common compensation element is able to compensate cross talk generated by the front end and cross talk generated by the rear end so that the results of measurements from the front side and from the rear side are equal.

Reference Signs List
1 jack
2 main housing
3 support member
4 plug interface contacts
5 printed circuit board
6 through-hole
7 insulation displacement contact
7a pin
8 through-hole
9 rear housing
11 passageway
12 guide piece
13 flap
14 dust shutter
15 layer
16 structure acting as capacitor
17 structure acting as inductor
18 vertical conductive paths
19 continuous coating
21 cut-out

The invention claimed is:

1. A telecommunications jack comprising:
a housing defining a port for receiving a plug;
contacts for making an electrical connection with wires of a cable;
interface contacts for making an electrical connection with contacts of the plug; and
a multilayer printed circuit board (PCB) for electrically connecting the contacts and the interface contacts; wherein the multilayer PCB comprising a free-floating ground plane structure formed from two outer layers of the multilayer PCB and a plurality of internal layers having a plurality of electronic devices disposed thereon; each of the two outer layers of the multilayer PCB include a continuous coating of an electrically conductive material covering at least those parts of the PCB that include the electronic devices and the continuous coating of the two outer layers of the PCB are electrically connected with each other and are electrically isolated from the internal layers of the PCB.

2. The telecommunications jack according to claim 1, wherein free-floating ground plane structure forms a Faraday cage around the interior layers of the PCB.

3. The telecommunications jack according to claim 1, wherein the jack is a RJ 45 jack.

4. The telecommunications jack according to claim 1, wherein the electrically conductive material of the continuous coatings of the two outer layers of the PCB is copper.

5. The telecommunications jack according to claim 1, wherein the continuous coatings of the two outer layers of the PCB provide openings around connection areas for receiving the contacts and the interface contacts of the telecommunications jack.

6. The telecommunications jack according to claim 1, wherein the continuous coatings of the two outer layers of the PCB provide openings around vertical conductive paths that connect the continuous coatings with each other.

7. The telecommunications jack according to claim 1, wherein the continuous coatings are electrically connected with the vertical conductive paths over small paths.

8. The telecommunications jack according to claim 1, wherein the PCB contains compensation circuits formed by the electronic devices.

9. The telecommunications jack according to claim 1, wherein the electronic devices of the PCB are circuit elements such as capacitors and/or inductors.

10. The telecommunications jack according to claim 9, wherein the circuit elements are translated into patterns that are able to deliver compensation characteristics.

11. The telecommunications jack according to claim 9, wherein the circuit elements are arranged within the PCB over more than one layer.

* * * * *